United States Patent
KleinOsowski et al.

(10) Patent No.: US 7,774,732 B2
(45) Date of Patent: Aug. 10, 2010

(54) METHOD FOR RADIATION TOLERANCE BY AUTOMATED PLACEMENT

(75) Inventors: AJ KleinOsowski, Austin, TX (US); Scott M. Willenborg, Stewartville, MN (US); Bruce B. Winter, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 453 days.

(21) Appl. No.: 11/838,368

(22) Filed: Aug. 14, 2007

(65) Prior Publication Data

US 2009/0049418 A1 Feb. 19, 2009

(51) Int. Cl.
G06F 17/50 (2006.01)
(52) U.S. Cl. .................. 716/10; 716/8; 716/9
(58) Field of Classification Search ................ 716/8–10
See application file for complete search history.

(56) References Cited

U.S. PATENT DOCUMENTS

| | | | | |
|---|---|---|---|---|
| 6,834,380 B2 * | 12/2004 | Khazei | | 716/10 |
| 7,286,393 B2 * | 10/2007 | Hynes et al. | | 365/158 |
| 2002/0050371 A1 * | 5/2002 | Czjakowski et al. | | 174/35 R |
| 2002/0148979 A1 * | 10/2002 | Featherby et al. | | 250/515.1 |
| 2006/0277515 A1 * | 12/2006 | Curtin et al. | | 716/10 |
| 2007/0162880 A1 * | 7/2007 | Carlson et al. | | 716/8 |
| 2008/0072200 A1 * | 3/2008 | Mo | | 716/7 |
| 2008/0235636 A1 * | 9/2008 | Kamp | | 716/4 |
| 2009/0125856 A1 * | 5/2009 | Acuna et al. | | 716/5 |

* cited by examiner

*Primary Examiner*—Stacy A Whitmore
(74) *Attorney, Agent, or Firm*—Libby Z. Handelsman; Jack V. Musgrove

(57) ABSTRACT

A method of designing a layout of an integrated circuit for increased radiation tolerance by ensuring that any critical components (those deemed particularly sensitive to radiation-induced soft errors) are at spacings greater than a predetermined threshold based on particle migration within the silicon substrate. The method starts with an initial placement, identifies the objects for which radiation tolerance is desired, determines whether any of those objects and, if so, moves the relevant objects to increase the spacing. An exemplary threshold for contemporary CMOS device technologies is 5 μm. The objects can be moved by vertically and/or horizontally shifting away from a reference point of the integrated circuit. The critical objects may include triplicated (redundant) structures, clock control latches, or a reset bit. The method can be used in conjunction with other placement optimizations such as area, power and timing.

21 Claims, 4 Drawing Sheets

METHOD FOR RADIATION TOLERANCE BY AUTOMATED PLACEMENT

BACKGROUND OF THE INVENTION

1. Field of the Invention

The present invention generally relates to the fabrication and design of semiconductor chips and integrated circuits, and more particularly to a method of designing the physical layout (placement) of latches and other logic cells to improve radiation tolerance.

2. Description of the Related Art

Integrated circuits are used for a wide variety of electronic applications, from simple devices such as wristwatches to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files in an intermediate form that describe the layout. The design files are then converted into pattern generator files that are used to produce patterns called masks by an optical or electron beam pattern generator. During fabrication, these masks are used to pattern a silicon wafer using a sequence of photolithographic steps. The process of converting the specifications of a circuit into a layout is called the physical design.

Cell placement in semiconductor fabrication involves a determination of where particular cells should optimally (or near-optimally) be located on the surface of a integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA) including Verilog, VHDL and TDML. A typical EDA system receives one or more high level behavioral descriptions of an IC device, and translates this high level design language description into netlists of various levels of abstraction.

Placement algorithms are typically based on either a simulated annealing, top-down cut-based partitioning, or analytical paradigm (or some combination thereof). Recent years have seen the emergence of several new academic placement tools, especially in the top-down partitioning and analytical domains. The advent of multilevel partitioning as a fast and extremely effective algorithm for min-cut partitioning has helped spawn a new generation of top-down cut-based placers. A placer in this class partitions the cells into either two (bisection) or four (quadrisection) regions of the chip, then recursively partitions each region until a global (coarse) placement is achieved. Analytical placers may allow cells to temporarily overlap in a design. Legalization is achieved by removing overlaps via either partitioning or by introducing additional forces and/or constraints to generate a new optimization problem. The classic analytical placers, PROUD and GORDIAN, both iteratively use bipartitioning techniques to remove overlaps. Eisenmann's force-based placer uses additional forces besides the well-known wire length dependent forces to reduce cell overlaps and to consider the placement area. Analytical placers optimally solve a relaxed placement formulation, such as minimizing total quadratic wire length. Quadratic placers generally use various numerical optimization techniques to solve a linear system. Two popular techniques are known as conjugate gradient (CG) and successive over-relaxation (SOR). The PROUD placer uses the SOR technique, while the GORDIAN placer employs the CG algorithm.

Placers can use other techniques to optimize circuit characteristics such as timing and power. One method involves the use of local clock buffers (LCBs) and clock splitters to distribute the clock signals. A typical clock control system has a clock generation circuit (e.g., a phase-lock loop) that generates a master clock signal which is fed to a clock distribution network that renders synchronized global clock signals at the LCBs. Each LCB adjusts the global clock duty cycle and edges to meet the requirements of respective circuit elements, such as local logic circuits or latches (the term "latch" as used herein stands for any clocked element which is usually a sink of a clock distribution network). Clock splitters may be used to produce multiple clock signals having different phases. Since this clock network is one of the largest power consumers among all of the interconnects, it is further beneficial to control the capacitive load of the LCBs, each of which is driving a set of many clock sinks. One approach for reducing the capacitive load is latch clustering, i.e., clusters of latches placed near the respective LCB of their clock domain. Latch clustering combined with LCBs can significantly reduce the total clock wire capacitance which in turn reduces overall clock power consumption. Since most of the latches are placed close to an LCB, clock skew is also reduced which helps improve the timing of the circuit.

Conventional placement with LCBs and latch clustering is illustrated in the flow chart of FIG. 1. The process begins with a preliminary placement based on an input layout for the circuit (1). The input layout can be provided by an EDA tool, or can simply be a random layout for the circuit elements. The preliminary placement locates all circuit elements, including clock sinks, in a region of the integrated circuit using for example quadratic placement. Other placement techniques may be used but quadratic placement often produces better results than alternatives such as min-cut based placement. The quadratic placement portion of the process solves the linear system $Ax=b$ where A is an optimization matrix, and x and b are vectors. During quadratic placement, cells are recursively partitioned into smaller bins until a target number of objects per bin is reached, such as five objects per bin. For the preliminary placement, all wires (edges) have the same net-weighting. The timing of the circuit is then analyzed and adjusted in early optimization (2). This optimization may include gate re-sizing and buffer insertion using a grid system such as a 50×50 grid in which buffers are assigned to grid cells having lower logic densities. A weighted placement (3) follows which is similar to step 1, but in the weighted placement the input layout is the output of the early optimization step 2 and different weights are applied to different edges based on the timing constraints. The partitioning may also be finer for the weighted placement, e.g., recursively partitioning until there are around two objects per bin. The weighted placement is then followed by late optimization which provides different logic optimizations such as buffer insertion but at a finer (or sometimes the same) level, for example, in a 100×100 grid (4). Late optimization may be the same as early optimization, the conceptual difference being that early optimization works on a circuit which is never processed by layout-driven optimization steps.

While these techniques provide adequate placement of cells with regard to their data interconnections, power and timing, there is an additional challenge for the designer in constructing a circuit that is resistant to soft errors, and this challenge is becoming more difficult with the latest technologies like 65-nanometer integrated circuits. Soft errors are caused by, e.g., alpha particle strikes emitted from packaging materials or by neutrons originating from cosmic radiation. The soft-error rate (SER) of a data processing system can exceed the combined failure rate of all hard-reliability mechanisms (gate oxide breakdown, electro-migration, etc.). Radiation tolerance has thus become a necessity for meeting robustness targets in advanced systems. All storage elements (random-access memory, latches, etc.) are highly susceptible to soft-error induced failures, but memory arrays are usually protected by error-correction codes (ECCs) while latches are usually not so protected. Soft errors in latches are accordingly often the major contributors to overall system SER.

Information stored in latches may include control, status or mode bits. For example, a data processing system might provide different mode configurations for clock control logic, and clock control latches can account for a significant portion of a microprocessor latch count. These clock buffer modes are set at system power-on and often must maintain their logical value for days or months to ensure proper performance of the local logic circuits. However, the values can be upset during microprocessor operation due to soft errors. An upset may be correctable by scanning in a new value, but systems may only allow input scanning in a limited manner such as at power-on, meaning that the system must be restarted if a clock control latch becomes incorrectly set. These reliability problems are particularly troublesome for harsher operating environments, such as aerospace systems where there is increased radiation (high-altitude or orbital space). Design parameters used to optimize circuits for terrestrial applications can actually be detrimental to radiation tolerance. Placers which try to minimize area will place many critical components closer to one another, making it more likely that a particle strike will cause multiple upsets. Current automated placement procedures give virtually no consideration to radiation tolerance. It would, therefore, be desirable to devise an improved placement method which could take into account critical component placement for hardened applications. It would be further advantageous if the method could be used in conjunction with existing EDA tools which provide other optimizations such as area, power and timing.

SUMMARY OF THE INVENTION

It is therefore one object of the present invention to provide an improved automated placement method for designing the layout of an integrated circuit.

It is another object of the present invention to provide such a method which takes radiation tolerance into consideration for critical components.

It is yet another object of the present invention to provide a method of designing an integrated circuit having robust (hardened) redundant components for aerospace applications.

The foregoing objects are achieved in a method of designing a layout of an integrated circuit by receiving initial locations for objects of the integrated circuit according to an initial placement, identifying a subset of the objects for which radiation tolerance is desired, determining that at least two objects in the subset of objects have a spacing that is less than a predetermined threshold, moving at least one of the two objects to increase the spacing above the predetermined threshold, and storing current locations for the objects for later processing. An exemplary threshold for contemporary CMOS device technologies is 5 μm. The objects can be moved by vertically and/or horizontally shifting away from a reference point of the integrated circuit. The subset of objects may include triplicated (redundant) structures, clock control latches, or a reset latch of the integrated circuit having a logical bit which controls a reboot of a data processing system.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

DESCRIPTION OF THE PREFERRED EMBODIMENT(S)

Figure 1:
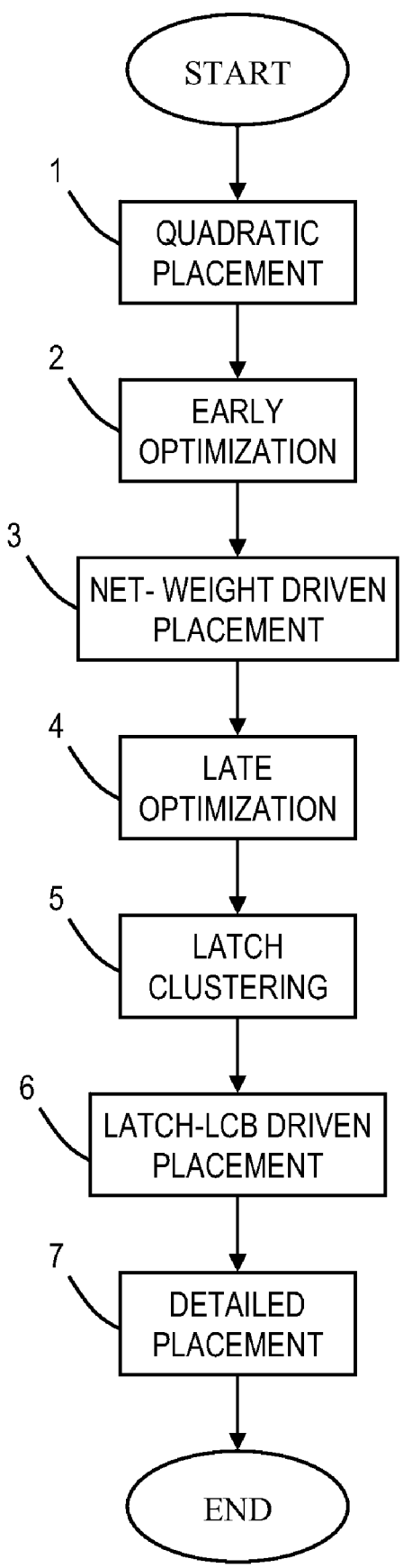
FIG. 1 is a chart illustrating the logical flow for a conventional latch placement technique with clock optimization followed by latch-LCB driven placement.
Figure 2:
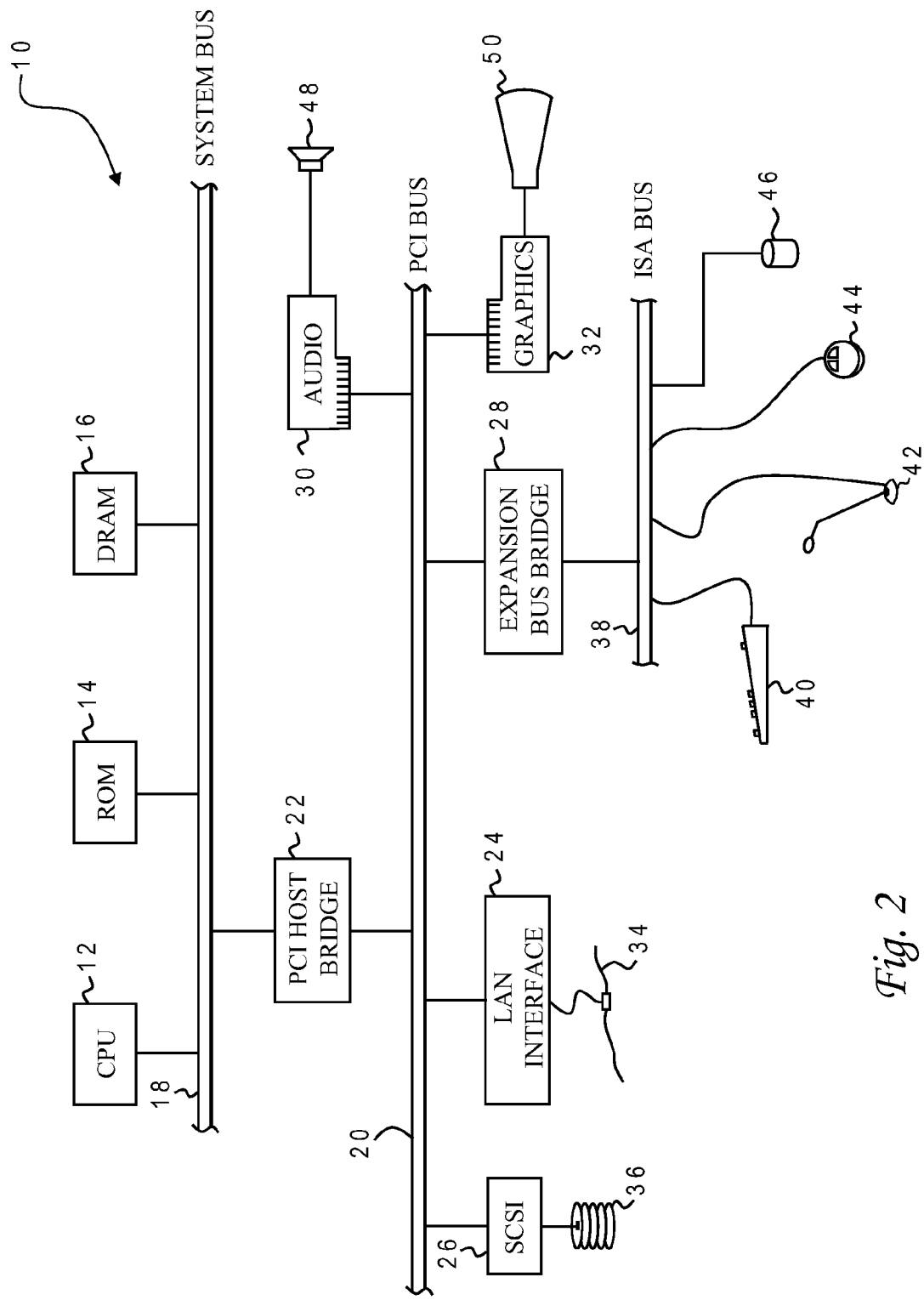
FIG. 2 is a block diagram of a computer system programmed to carry out computer-aided design of an integrated circuit in accordance with one implementation of the present invention.

With reference now to the figures, and in particular with reference to FIG. 2, there is depicted one embodiment 10 of a computer system programmed to carry out computer-aided design of an integrated circuit in accordance with one implementation of the present invention. System 10 includes a central processing unit (CPU) 12 which carries out program instructions, firmware or read-only memory (ROM) 14 which stores the system's basic input/output logic, and a dynamic random access memory (DRAM) 16 which temporarily stores program instructions and operand data used by CPU 12. CPU 12, ROM 14 and DRAM 16 are all connected to a system bus 18. There may be additional structures in the memory hierarchy which are not depicted, such as on-board (L1) and second-level (L2) caches. In high performance implementations, system 10 may include multiple CPUs and a distributed system memory.

CPU 12, ROM 14 and DRAM 16 are also coupled to a peripheral component interconnect (PCI) local bus 20 using a PCI host bridge 22. PCI host bridge 22 provides a low latency path through which processor 12 may access PCI devices mapped anywhere within bus memory or I/O address spaces. PCI host bridge 22 also provides a high bandwidth path to allow the PCI devices to access DRAM 16. Attached to PCI local bus 20 are a local area network (LAN) adapter 24, a small computer system interface (SCSI) adapter 26, an expansion bus bridge 28, an audio adapter 30, and a graphics adapter 32. LAN adapter 24 may be used to connect computer system 10 to an external computer network 34, such as the Internet. A small computer system interface (SCSI) adapter 26 is used to control high-speed SCSI disk drive 36. Disk drive 36 stores the program instructions and data in a more permanent state, including the program which embodies the present invention as explained further below, as well as any resultant data to be stored for later processing. Expansion bus bridge 28 is used to couple an industry standard architecture (ISA) expansion bus 38 to PCI local bus 20. As shown, several user input devices are connected to ISA bus 38, including a keyboard 40, a microphone 42, and a graphical pointing device (mouse) 44. Other devices may also be attached to ISA bus 38, such as a CD-ROM drive 46. Audio adapter 30 controls audio output to a speaker 48, and graphics adapter 32 controls visual output to a display monitor 50, to allow the user to carry out the integrated circuit design as taught herein.

While the illustrative implementation provides the program instructions embodying the present invention on disk drive 36, those skilled in the art will appreciate that the invention can be embodied in a program product utilizing other computer-readable media, including transmission media.

Computer system 10 carries out program instructions for placement of critical components in the design of an integrated circuit using a novel technique wherein the components are initially placed and/or optimized by conventional methods and thereafter are optimized with regard to radiation tolerance as explained below. Accordingly, a program embodying the invention may include conventional aspects of various EDA tools such as quadratic optimizers, cut-based partitioners and buffer insertion algorithms, and these details will become apparent to those skilled in the art upon reference to this disclosure.

Figure 3:
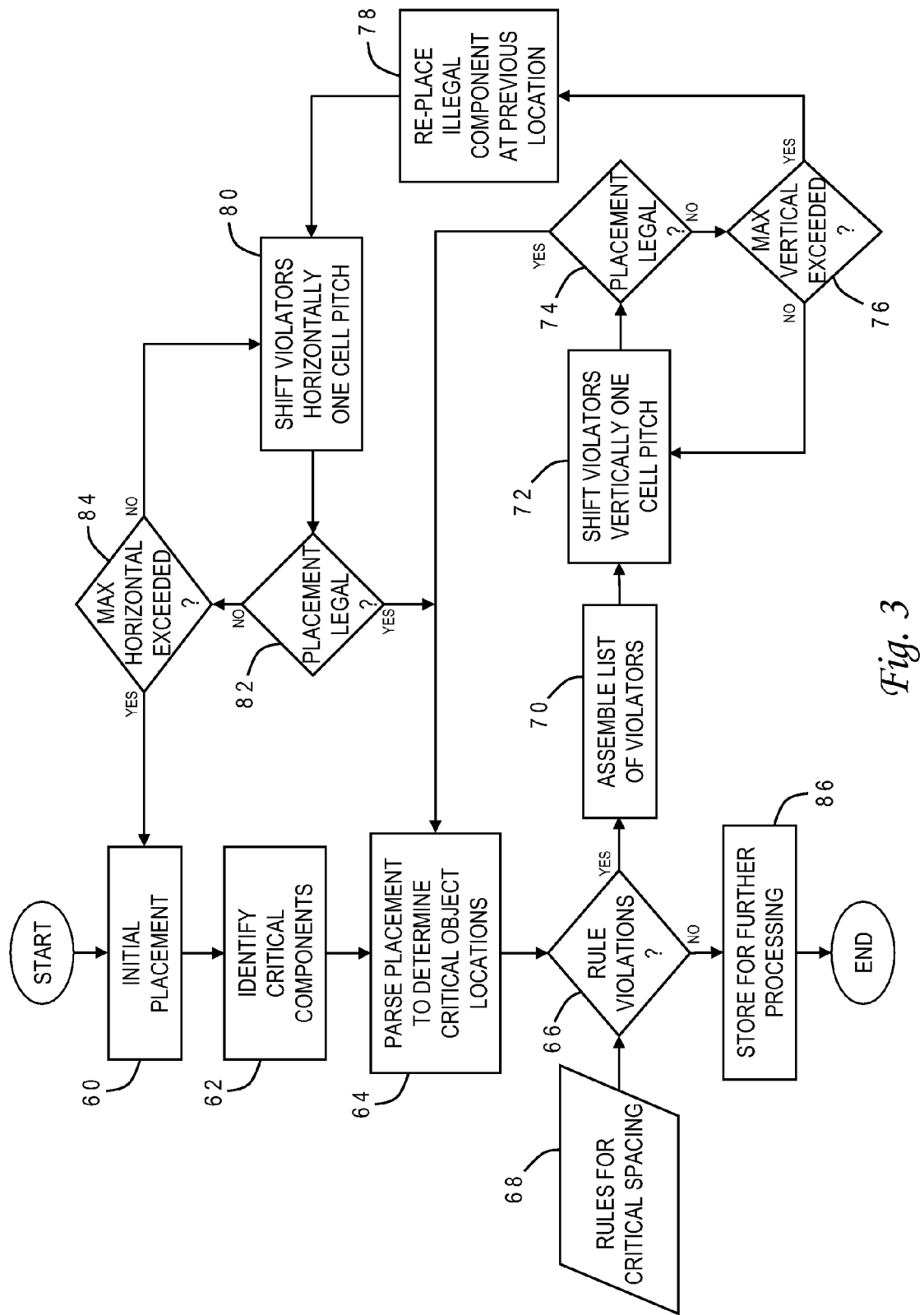
FIG. 3 is a chart illustrating the logical flow for modifying an initial placement of objects in an integrated circuit design by moving any critical components whose locations violate spacing rules, in accordance with one implementation of the present invention.

The present invention may be further understood with reference to the chart of FIG. 3 which illustrates the logical flow according to one implementation. The procedure begins with an initial placement of the objects in the integrated circuit design which is derived using conventional tools (60). The initial placement may include optimization for, e.g., area, power and/or timing. The term "initial" as used herein does not necessarily mean that this placement is the first layout conceived for the objects, but rather refers to any previous layout that is the starting point for the present invention. The invention could be applied anywhere along the placement process, e.g., after a first (quadratic) placement, after driven placements, or after detailed placement (or after all of these steps). The invention could also be applied during intermediate steps of a conventional placement routine, i.e., interleaved.

Any subset of components of the integrated circuit which are considered sensitive to radiation-induced soft errors are identified (62). The components may be identified as critical manually by marking as such during the design process, or automatically by using a design library which has a critical component flag or indicator for certain components. Critical components may include, by way of example and without limitation, redundant structures such as triplicated latches, configuration flip-flops that provide clock control, long dwell-time bits, or a reset bit used to reboot a data processing system.

The initial placement is then parsed to determine the locations of any components which have been deemed critical for purposes of radiation tolerance (64). These locations are examined to find any rule violations (66). The rule violations are based on a set of critical spacing rules (68). The critical spacing rules may vary based on the specific integrated circuit application and the fabrication technology. In a high-altitude or orbital space environment, for example, the subatomic particles of interest may have a range of about 4 µm once they enter the silicon chip, so an exemplary spacing threshold is 5 µm. In this manner, a single radiation event will most likely not upset more than one critical component since the large spacing reduces the likelihood of significant charge migration within the silicon substrate. A single threshold value can be used for all critical components, or different spacings can be used for different types of critical components.

If there are rule violations, it is necessary to move at least one of the critical components and resolve any new overlaps. A list of the affected critical components is first assembled (70). Violators in the list are shifted vertically by a fixed number of cell pitches, e.g., one cell pitch (i.e., the minimum increment that cells are to be fabricated at according to the particular design methodology), using a given corner of the IC region as a reference point (72). The placement is then re-examined to determine if it is still legal according to any other relevant design criteria (74). For example, the shifting may place a component beyond the vertical boundary, or there may be a design requirement that cells are located at width/height multiples of certain units such as 2.3 µm or 4 µm. If the new placement is legal, the procedure returns to step 64 to see if there are still any radiation rule violations. If the new placement is not legal, a further check is made to see if the vertical boundary has been exceeded (76). If the vertical boundary is not the reason for the illegality, the procedure returns to step 72 to shift the violators vertically by another cell pitch. If the vertical limit is the problem, the illegal components are re-placed to their previous position (78) and are shifted horizontally instead, by one cell pitch (80). The new placement is again examined to determine if it is still legal according to other design criteria (82). If the new placement is legal, the procedure returns to step 64 to see if there are still any radiation rule violations. If the new placement is not legal, a further check is made to see if the horizontal boundary has been exceeded (84). If the horizontal boundary is not the reason for the illegality, the procedure returns to step 80 to shift the violators horizontally by another cell pitch. If the horizontal limit is the problem, the process starts over with the initial placement (60) but the critical spacing rules are relaxed.

Those skilled in the art will appreciate that the terms "vertically" and "horizontally" as used herein are relative terms and that they may be applied to any frame of reference having orthogonal axes. The cells can be moved in other manners depending upon the particular design constraints. For example, a violator can be shifted both vertically and horizontally in the same step, and the amount of the shift can vary. The pitch change may be incremented (e.g., 1, 2, 3, . . . ) with successive passes after legalization. Incrementing the pitch change allows the critical cell to eventually jump over larger neighboring blocks. Incrementing both the vertical and horizontal shifts (at the same time) finds the shortest direction for a legal placement. The pitch change can also be decremented if there is more free space in the opposite direction. These features may allow the process to achieve a properly spaced solution with relaxing the rule spacing requirement.

Once there are no rule violations, the procedure is finished and the object locations for the current layout are stored for later processing (86). The later processing may include additional placement/optimization or the next step in production, e.g., conversion into mask pattern generator files.

Figure 4A:
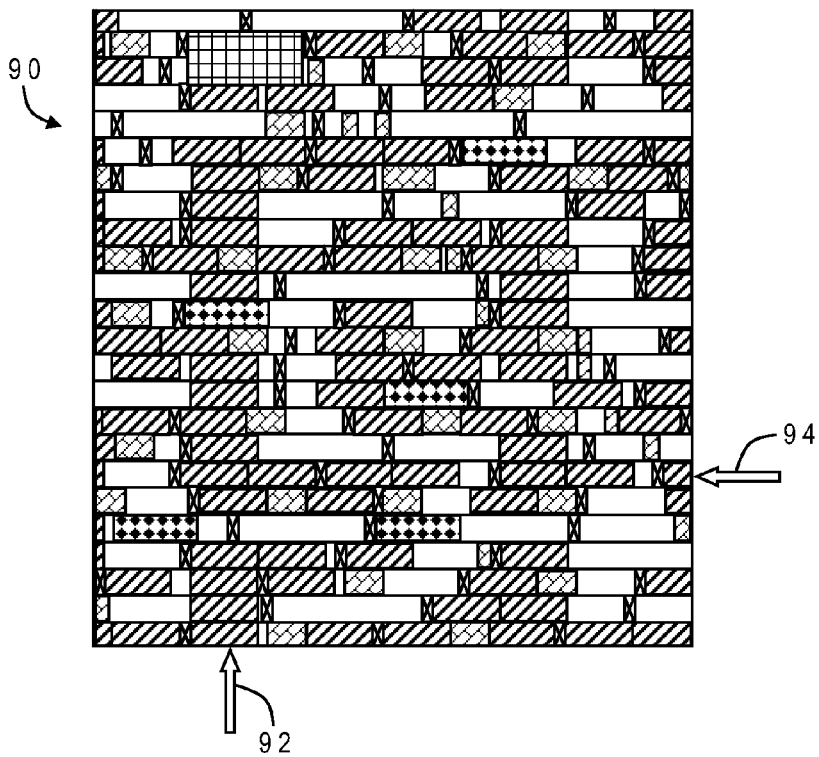
FIG. 4A is a plan view of an initial placement of objects in an exemplary integrated circuit design which are to be further checked for radiation tolerant spacing.
Figure 4B:
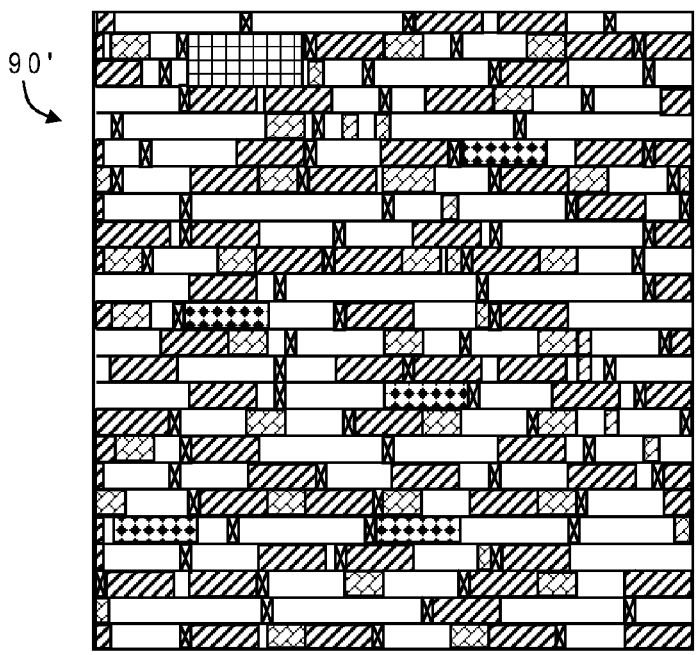
FIG. 4B is a plan view of a modified placement of the objects in the integrated circuit design of FIG. 4A with increased spacing for certain critical components in accordance with one embodiment of the present invention.

FIGS. 4A and 4B illustrate an example of a circuit which is optimized for radiation tolerance in accordance with the present invention. FIG. 4A is the circuit 90 as laid out in an initial placement, and has various functional cells or blocks including latches, a local clock buffer (LCB), combinational gates, Nwell/Pwell contacts, and clock splitters. In this example the latches are deemed critical components for purposes of radiation tolerance. Many of the latch blocks are adjacent one another or otherwise in close proximity, such as the latches in the vertical extent indicated at 92 and the latches in the row indicated at 94. FIG. 4B is the modified circuit 90' in which these critical components have been moved to increase the spacings.

The method thus keeps critical circuits a safe distance apart for improved radiation hardening. The present invention may also advantageously be used in conjunction with existing placement optimizations and automated methods, such as the LCB power and timing optimization described in U.S. patent application Ser. No. 11/610,567, which is hereby incorporated. The method is usable for any type of integrated circuit, custom or application-specific (ASIC), and has particular applicability to circuits used in aerospace systems where there is increased radiation.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. An automated method for designing a layout of an integrated circuit using a computer system, comprising:
   receiving initial locations for objects of the integrated circuit according to an initial placement;
   identifying a subset of the objects for which radiation tolerance is desired;
   determining that at least two objects in the subset of objects have a spacing that is less than a predetermined threshold;
   responsive to said determining, moving at least one of the two objects to increase the spacing above the predetermined threshold; and
   after said moving, storing current locations for the objects in the computer system.

2. The method of claim 1 wherein the predetermined threshold is 5 µm.

3. The method of claim 1 wherein the at least one of the two objects is moved by vertically shifting away from a reference point of the integrated circuit.

4. The method of claim 1 wherein the at least one of the two objects is moved by horizontally shifting away from a reference point of the integrated circuit.

5. The method of claim 1 wherein the subset of objects includes triplicated structures of the integrated circuit.

6. The method of claim 1 wherein the subset of objects includes clock control latches of the integrated circuit.

7. The method of claim 1 wherein the subset of objects includes a reset latch of the integrated circuit having a logical bit which controls a reboot of a data processing system.

8. A computer system comprising:
   one or more processors which process program instructions;
   a memory device connected to said one or more processors; and
   program instructions residing in said memory device for designing a layout of an integrated circuit by receiving initial locations for objects of the integrated circuit according to an initial placement, identifying a subset of the objects for which radiation tolerance is desired, determining that at least two objects in the subset of objects have a spacing that is less than a predetermined threshold, responsive to said determining moving at least one of the two objects to increase the spacing above the predetermined threshold and, after said moving, storing current locations for the objects.

9. The computer system of claim 8 wherein the predetermined threshold is 5 µm.

10. The computer system of claim 8 wherein the at least one of the two objects is moved by vertically shifting away from a reference point of the integrated circuit.

11. The computer system of claim 8 wherein the at least one of the two objects is moved by horizontally shifting away from a reference point of the integrated circuit.

12. The computer system of claim 8 wherein the subset of objects includes triplicated structures of the integrated circuit.

13. The computer system of claim 8 wherein the subset of objects includes clock control latches of the integrated circuit.

14. The computer system of claim 8 wherein the subset of objects includes a reset latch of the integrated circuit having a logical bit which controls a reboot of a data processing system.

15. A computer program product comprising:
   a computer-readable medium; and
   program instructions residing in said medium for designing a layout of an integrated circuit by receiving initial locations for objects of the integrated circuit according to an initial placement, identifying a subset of the objects for which radiation tolerance is desired, determining that at least two objects in the subset of objects have a spacing that is less than a predetermined threshold, responsive to said determining moving at least one of the two objects to increase the spacing above the predetermined threshold and, after said moving, storing current locations for the objects.

16. The computer program product of claim 15 wherein the predetermined threshold is 5 μm.

17. The computer program product of claim 15 wherein the at least one of the two objects is moved by vertically shifting away from a reference point of the integrated circuit.

18. The computer program product of claim 15 wherein the at least one of the two objects is moved by horizontally shifting away from a reference point of the integrated circuit.

19. The computer program product of claim 15 wherein the subset of objects includes triplicated structures of the integrated circuit.

20. The computer program product of claim 15 wherein the subset of objects includes clock control latches of the integrated circuit.

21. The computer program product of claim 15 wherein the subset of objects includes a reset latch of the integrated circuit having a logical bit which controls a reboot of a data processing system.

* * * * *